(12) United States Patent
Yang et al.

(10) Patent No.: US 12,131,670 B2
(45) Date of Patent: Oct. 29, 2024

(54) ELECTRONIC SHELF LABEL AND METHOD FOR ASSEMBLING THE SAME

(71) Applicant: BOE TECHNOLOGY GROUP CO., LTD., Beijing (CN)

(72) Inventors: Xinxin Yang, Beijing (CN); Xin Li, Beijing (CN); Hui Rao, Beijing (CN); Zhiguo Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1034 days.

(21) Appl. No.: 16/971,190

(22) PCT Filed: Feb. 12, 2020

(86) PCT No.: PCT/CN2020/074860
§ 371 (c)(1),
(2) Date: Aug. 19, 2020

(87) PCT Pub. No.: WO2020/168955
PCT Pub. Date: Aug. 27, 2020

(65) Prior Publication Data
US 2021/0225206 A1   Jul. 22, 2021

(30) Foreign Application Priority Data

Feb. 19, 2019  (CN) .......................... 201920214115.9

(51) Int. Cl.
*G09F 3/20* (2006.01)
*H05K 1/18* (2006.01)
*H05K 5/00* (2006.01)
*H05K 1/14* (2006.01)

(52) U.S. Cl.
CPC ............... *G09F 3/208* (2013.01); *H05K 1/18* (2013.01); *H05K 5/0069* (2013.01); *H05K 1/141* (2013.01);
(Continued)

(58) Field of Classification Search
CPC .......... G09F 3/208; G09F 3/204; H05K 1/18; H05K 5/0069; H05K 1/141; H05K 5/0017;
(Continued)

(56) References Cited

U.S. PATENT DOCUMENTS

2002/0142640 A1   10/2002   Abe
2021/0272424 A1*  9/2021   Trudnak ................... G01K 1/06

FOREIGN PATENT DOCUMENTS

CN   104281867 A  *  1/2015
CN   107067064 A      8/2017
(Continued)

OTHER PUBLICATIONS

International Search Report of PCT/CN2020/074860 in Chinese, mailed May 9, 2020 with English Translation.
(Continued)

*Primary Examiner* — Cassandra Davis
(74) *Attorney, Agent, or Firm* — Collard & Roe, P.C.

(57) ABSTRACT

An electronic shelf label and a method for assembling the same. The electronic shelf label including: a housing, the housing including a front housing and a rear housing, the front housing and the rear housing being coupled with each other, a chamber being provided between the front housing and the rear housing, the rear housing including an opening; a motherboard, the motherboard being located in the chamber; a back plate, the back plate covering the opening, the motherboard being detachably coupled to the back plate, the back plate being detachably coupled to the rear housing, and an orthographic projection of the back plate in a plane where the rear housing is located being located in the rear housing.

15 Claims, 4 Drawing Sheets

(52) U.S. Cl.
CPC ......... *H05K 5/0017* (2013.01); *H05K 5/0052* (2013.01); *H05K 5/006* (2013.01); *H05K 2201/10189* (2013.01); *H05K 2201/10522* (2013.01)

(58) Field of Classification Search
CPC ................. H05K 5/0052; H05K 5/006; H05K 2201/10189; H05K 2201/10522; H05K 1/144
See application file for complete search history.

(56) References Cited

FOREIGN PATENT DOCUMENTS

| | | | | |
|---|---|---|---|---|
| CN | 206639241 U | 11/2017 | | |
| CN | 107492312 A | 12/2017 | | |
| CN | 207781082 U | 8/2018 | | |
| CN | 208314842 U | 1/2019 | | |
| CN | 209281790 U | 8/2019 | | |
| CN | 210378274 U | * | 4/2020 | |
| EP | 2876628 A2 | * | 5/2015 | ....... G02F 1/133382 |
| GB | 2249854 A | * | 5/1992 | ............ G09F 3/204 |
| JP | 2002-289295 A | | 10/2002 | |
| KR | 2001055976 A | * | 7/2001 | ........... H05B 6/6435 |

OTHER PUBLICATIONS

Notice of Transmittal of the International Search Report of PCT/CN2020/074860 in Chinese, mailed May 9, 2020.

Written Opinion of the International Searching Authority of PCT/CN2020/074860 in Chinese, mailed May 9, 2020.

* cited by examiner

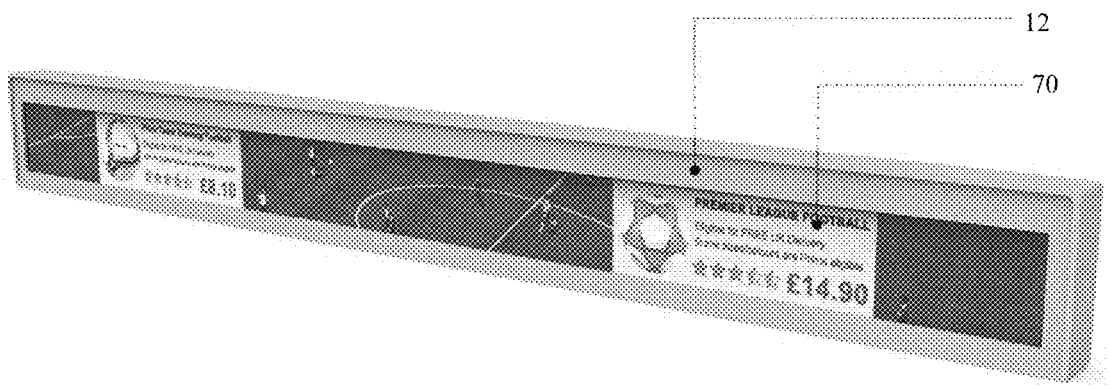

FIG. 7

```
┌─────────────────────────────────────────────────────────────┐
│   coupling the front housing with the bottom housing to form the   │
│                          chamber                            │
└─────────────────────────────────────────────────────────────┘
                              │
┌─────────────────────────────────────────────────────────────┐
│            fixing the motherboard to the back plate         │
└─────────────────────────────────────────────────────────────┘
                              │
┌─────────────────────────────────────────────────────────────┐
│ fixing the back plate to the bottom housing, wherein at a same time of fixing │
│ the back plate to the bottom housing, the motherboard passes through the │
│ opening of the bottom housing and reaches the chamber       │
└─────────────────────────────────────────────────────────────┘
```

FIG.8

ELECTRONIC SHELF LABEL AND METHOD FOR ASSEMBLING THE SAME

CROSS REFERENCE TO RELATED APPLICATIONS

This application is the National Stage of PCT/CN2020/074860 filed on Feb. 12, 2020, which claims priority under 35 U.S.C. § 119 of Chinese Application No. 201920214115.9 filed on Feb. 19, 2019, the disclosure of which is incorporated by reference.

TECHNICAL FIELD

Embodiments of the present invention relates to an electronic shelf label and a method for assembling the same.

BACKGROUND

With the continuous development of science and technology, electronic display screens have been widely used. For example, in the retail and warehousing industries, electronic shelf labels are required to display the price and specifications of goods.

SUMMARY

Embodiments of the present disclosure provide an electronic shelf label and a method for assembling the same.

According to one aspect of the present disclosure, it is provided an electronic shelf label, comprising:
- a housing, the housing comprising a front housing and a rear housing, the front housing and the rear housing being coupled with each other, a chamber being provided between the front housing and the rear housing, the rear housing comprising an opening;
- a motherboard, the motherboard being located in the chamber;
- a back plate, the back plate covering the opening, the motherboard being detachably coupled to the back plate, the back plate being detachably coupled to the rear housing, and an orthographic projection of the back plate in a plane where the rear housing is located is located in the rear housing.

According to another aspect of the present disclosure, it is provided a method for assembling the above electronic shelf label, the method comprising:
- coupling the front housing with the rear housing to form the chamber;
- fixing the motherboard to the back plate; and
- fixing the back plate to the rear housing,
- wherein at a same time of fixing the back plate to the rear housing, the motherboard passes through the opening of the rear housing and reaches the chamber.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 7 is a schematically exterior view of an electronic shelf label according to an embodiment of the present disclosure;

FIG. 8 is a flowchart of a method for assembling an electronic shelf label according to an embodiment of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects or equivalents thereof listed after these terms, but do not preclude the other elements or objects. The phrases "connect", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
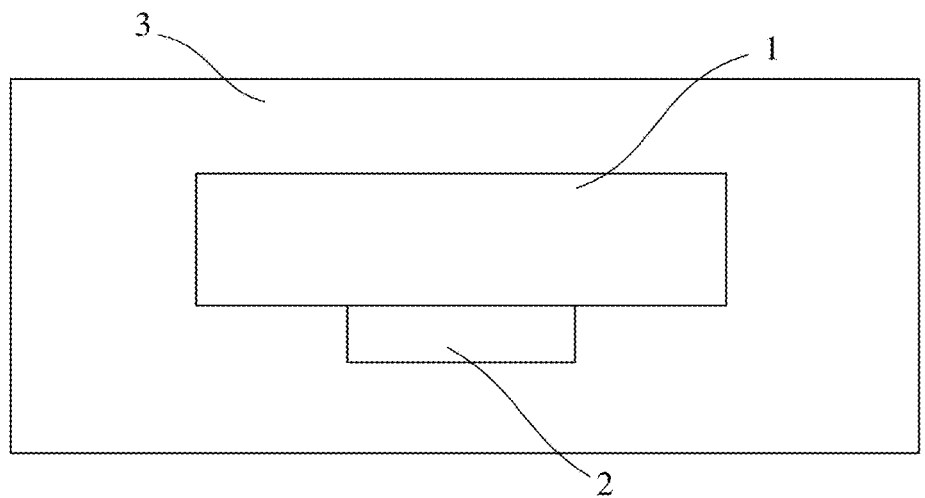
FIG. 1 is a schematically structural view of an ESL (electronic shelf label) strip-shaped screen and a connector.

As shown in FIG. 1, the present disclosure provides an electronic shelf label (ESL for short), including a strip-shaped screen 1 and a connector 2. During mounting, the strip-shaped screen 1 is normally fixed on a to-be-fixed plane 3 by the connector 2. The connector 2 is provided with the connection components therein. Because the connector 2 and the ESL strip-shaped screen 1 are two independent structures, after the ESL strip-shaped screen 1 is mounted to the connector 2, a part of the connector 2 is exposed by the ESL strip-shaped screen 1, which makes the overall structure cumbersome and unaesthetic.

According to an embodiment of the present disclosure, it is provided an electronic shelf label, including: a housing, the housing includes a front housing and a rear housing, the front housing and the rear housing are coupled with each other, a chamber is provided between the front housing and the rear housing, the rear housing includes an opening; a motherboard, the motherboard is located in the chamber; a back plate, the back plate covers the opening, the motherboard is detachably coupled to the back plate, the back plate is detachably coupled to the rear housing, and an orthographic projection of the back plate in a plane where the rear housing is located is in the rear housing.

In the electronic shelf label of the above embodiment, the connection components including the motherboard and the back plate are arranged in the chamber of the housing, which not only improves the aesthetics of the electronic shelf label, but also effectively reduces the volume of the overall equipment, which has the beneficial effects of compact structure and easy installation.

FIGS. 2 to 5 are schematically structural views of an electronic shelf label provided by embodiments of the present disclosure. Embodiments of the present disclosure provide an electronic shelf label, including: a housing 10, a connection component 30 and a circuit board 40. The housing 10 includes a rear housing 11 and a front housing 12, the rear housing 11 is provided with an opening 111, the rear housing 11 and the front housing 12 are coupled with each other to form a chamber 13 rear housing.

For example, the connection component 30 includes: a motherboard 31, and a back plate 32 coupling to the motherboard 31. The motherboard 31 is located in the chamber 13. The back plate 32 is detachably coupled to the rear housing 11, and the back plate 32 covers the opening 111. The motherboard 31 is detachably coupled to the back plate 32, and an orthographic projection of the back plate 32 in a plane where the rear housing 11 is located falls within the rear housing 11, that is the orthographic projection of the back plate 32 in the plane where the rear housing 11 is located is completely located in the surface of the rear housing 11. In this way, both the motherboard 31 and the rear housing 11 are located on the side of the back plate 32 close to the front housing 12, so that the overall structure of the electronic shelf label is simple and aesthetic.

Figure 6:
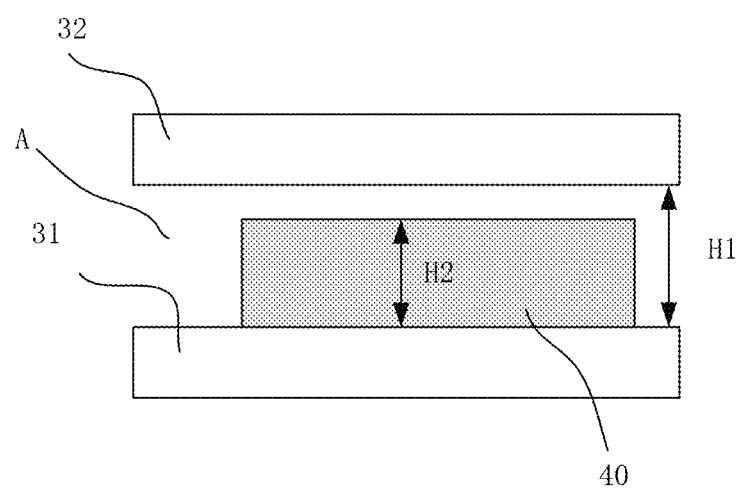
FIG. 6 is a schematically cross-sectional view of a motherboard and a back plate according to an embodiment of the present disclosure.

For example, the electronic shelf label further includes: the circuit board 40, the circuit board 40 is located on the side of the motherboard 31 facing towards the back plate 32, and the circuit board 40 is fixed to the motherboard 31. As shown in FIG. 6, a gap A is provided between the motherboard 31 and the back plate 32, the height H1 of the gap A is greater than or equal to the height H2 of the circuit board 40, so that the circuit board 40 can be accommodated. Further, in at least one example, the height H1 of the gap A is equal to the height H2 of the circuit board 40. In this way, the thickness of the electronic shelf label can be minimized to a maximal degree, such that the overall volume of the electronic shelf label is reduced.

In at least several embodiments, the motherboard includes a communication interface. The back plate has a convex portion, the convex portion has a cavity for accommodating the communication interface. For example, a surface of the motherboard 31 facing towards the back plate 32 is provided with a power interface 50. The back plate 32 is provided with a first convex portion 321 at a position corresponding to the power interface 50. The first convex portion 321 is provided with a first via hole 3211, and the first convex portion 321 covers the power interface 50. The end of the power interface 50 is connected with the first via hole 3211. Further, in at least one example, the end of the first convex portion 321 away from the back plate 32 is flush with the end of the power interface 50 away from the motherboard 31. In this way, the thickness and overall volume of the electronic shelf label are reduced as much as possible through the corresponding arrangement of the first convex portion 321 and the power interface 50.

For another example, a surface of the motherboard 31 facing towards the back plate 32 is further provided with a network interface 60. The back plate 32 is provided with a second convex portion 322 at a position corresponding to the network interface 60. The second convex portion 322 is provided with a second via hole 3221, and the second convex portion 322 covers the network interface 60. The end of the network interface 60 is connected with the second via hole 3221. Further, in at least one example, the end of the second convex portion 322 away from the back plate 32 is flush with the end of the network interface 60 away from the motherboard 31. In this way, the thickness and overall volume of the electronic shelf label are reduced as much as possible through the corresponding arrangement of the second convex portion 322 and the network interface 60.

Figure 4:
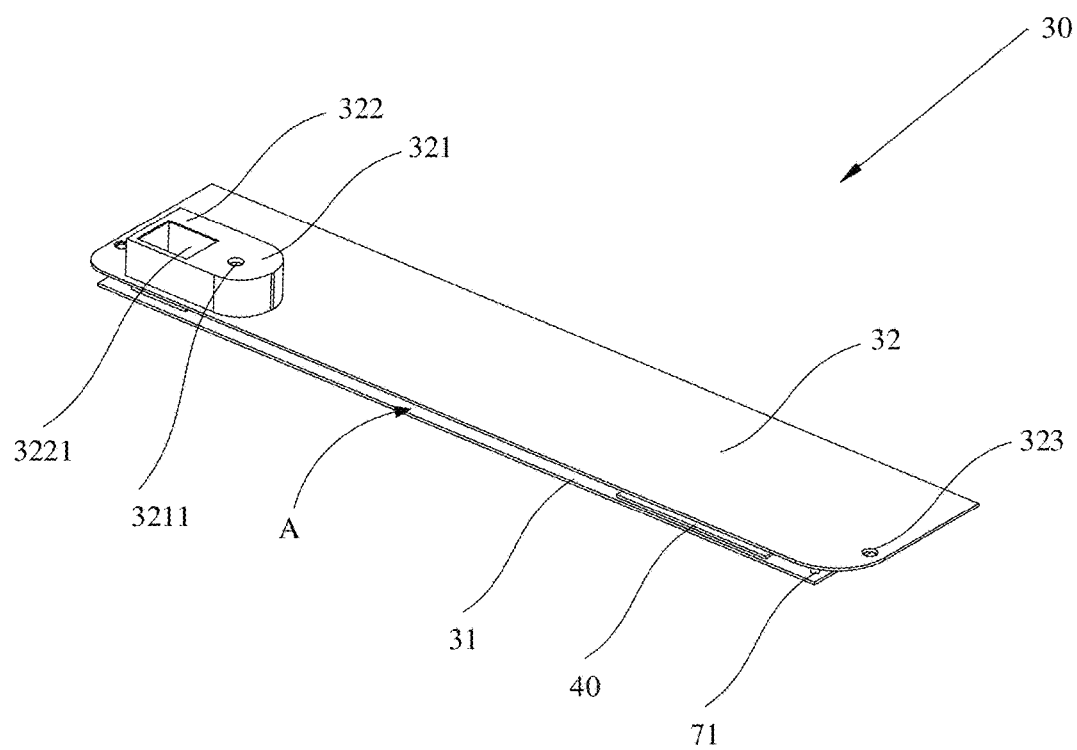
FIG. 4 is a schematically structural view in three dimensions of a motherboard and a back plate according to an embodiment of the present disclosure.
Figure 5:
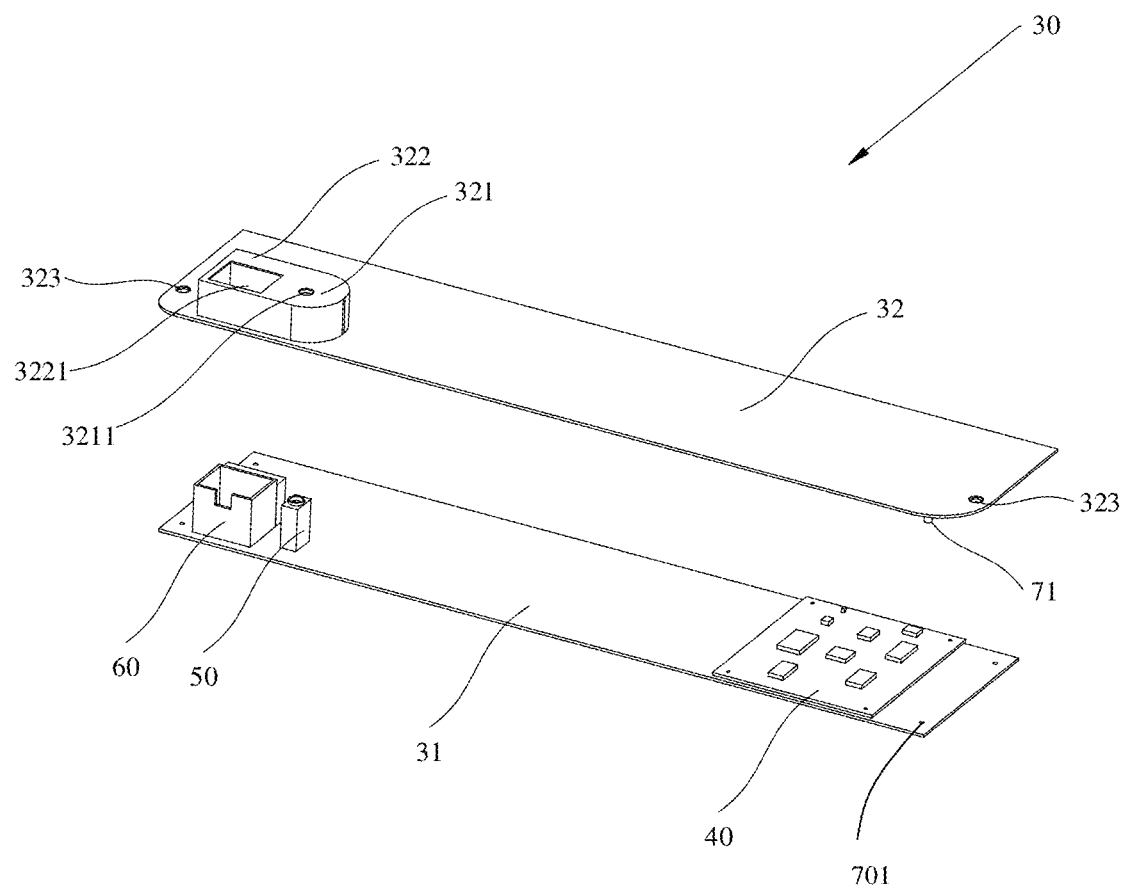
FIG. 5 is a schematically exploded structural view in three dimensions of a motherboard and a back plate according to an embodiment of the present disclosure.

In this embodiment, the network interface 60 and the power interface 50 are located on the same surface of the motherboard 31, and the network interface 60 and the power interface 50 are adjacent to each other. The second convex portion 322 and the first convex portion 321 are coupled to each other. For example, as shown in FIGS. 4 and 5, the second convex portion 322 and the first convex portion 321 are integrally formed to form an integral housing structure. In other embodiments, the second convex portion 322 and the first convex portion 321 may also be independent of each other. The positions of the second convex portion 322 and the first convex portion 321 are set according to the specific positions of the corresponding network interface 60 and the corresponding power interface 50.

For example, the second convex portion 322, the first convex portion 321 and the back plate 32 are integrally formed to form an integral structure for closing the rear housing 11.

For example, the back plate 32 together with the motherboard 31 is detachably coupled to the rear housing 11. In this way, the assembly process can be simplified and the disassembly is also convenient. For example, the motherboard 31 and the back plate 32 are firstly coupled to each other, and then the back plate 32 is coupled to the rear housing 11. The motherboard 31 is detachably coupled to the back plate 32 by a first fastener, and the back plate 32 is detachably coupled to the rear housing 11 by a second fastener. That is to say, the motherboard 31 is fixed to the housing through the back plate 32, which achieves the beneficial effect of simple installation process, and facilitates assembly and the disassembly work during maintenance.

Figure 2:
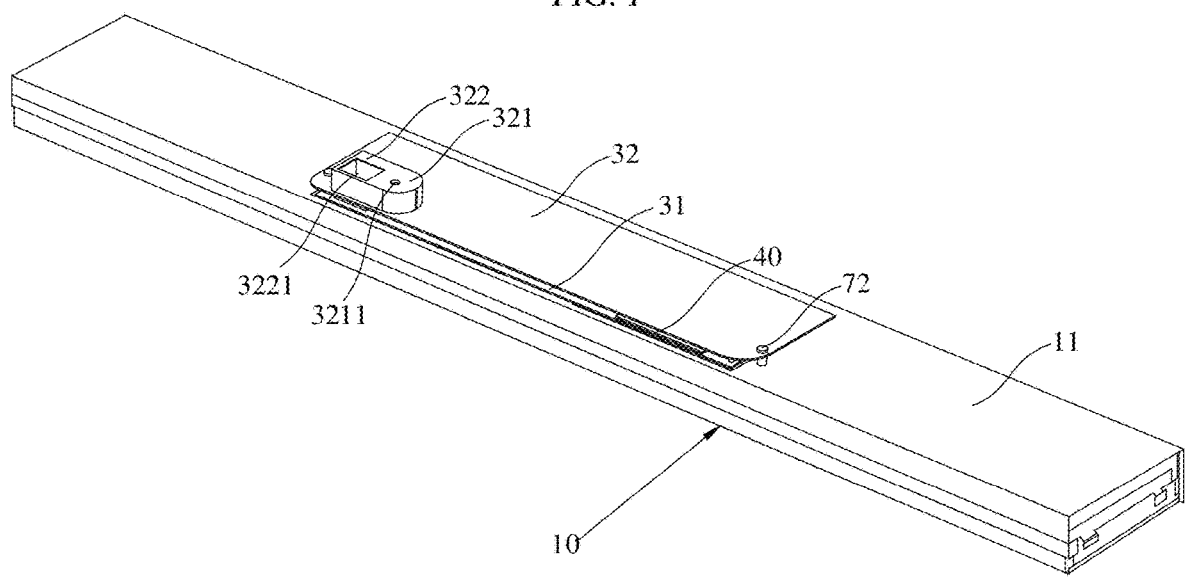
FIG. 2 is a schematically structural view in three dimensions of an electronic shelf label according to an embodiment of the present disclosure.
Figure 3:
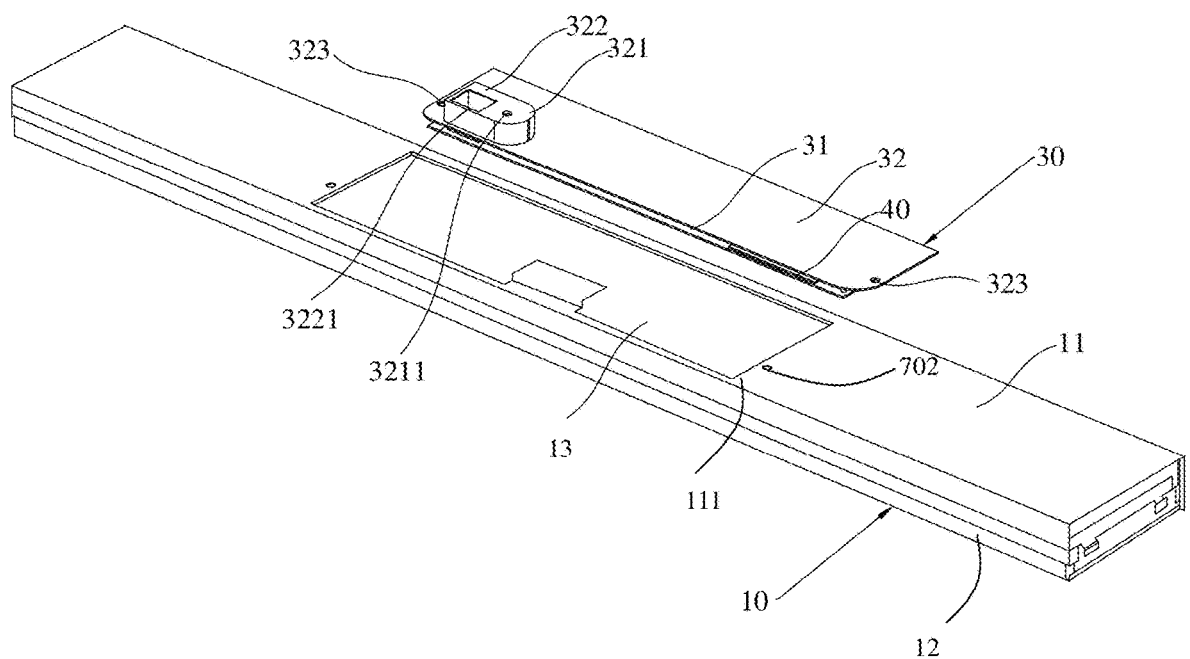
FIG. 3 is a schematically exploded structural view in three dimensions of an electronic shelf label according to an embodiment of the present disclosure.

For example, as shown in FIGS. 4 and 5, the first fastener is a rivet 71. The rivet 71 passes through a mounting hole 701 of the motherboard 31. In this way, the motherboard 31 is fixed to the surface of the back plate 32 facing towards the motherboard 31 by four rivets 71. As shown in FIGS. 2 and 3, the second fastener is a bolt 72, a mounting hole 323 is provided in the back plate 32, and a mounting hole 702 is provided in the rear housing 11. The bolt 72 passes through the mounting holes 323 and 702, so that the back plate 32 is fixed to the rear housing 11 by two bolts 72. The mounting hole 323 is provided at the edge of the back plate 32. For example, the first fastener is closer to the circuit board 40 than the second fastener, so that the coupling between the back plate 32 and the rear housing 11 is not affected when the motherboard 31 is fixed to the back plate 32.

For example, the motherboard 31 and the rear housing 11 are located on the same side of the back plate 32, which facilitates the removal of the back plate 32. In this embodiment, the area of the opening 111 is larger than the area of the motherboard 31, so that the motherboard 31 is easier to pass through the opening 111 of the rear housing 11 and reach the chamber 13.

For example, as shown in FIG. 7, the electronic shelf label is in the shape of a strip. The electronic shelf label further includes a display screen 70 embedded in the front housing 12. The area of the display screen 70 occupies more than ⅘ of the area of the front housing 12, which has better visual effects.

According to an embodiment of the present disclosure, it is further provided a method for assembling the electronic shelf label according to the previous embodiments, as shown in FIG. 8, the method including:

coupling the front housing with the rear housing to form the chamber;

fixing the motherboard to the back plate; and fixing the back plate to the rear housing, wherein at a same time of the fixing the back plate to the rear housing, the motherboard passes through the opening of the rear housing and reaches the chamber.

In this embodiment, before the back plate is fixed to the rear housing, the motherboard is fixed to the back plate first, which facilitates the disassembly and assembly of the back plate and the internal structure.

In the electronic shelf label and the method for assembling the electronic shelf label provided by the above embodiments, the volume of the overall device is effectively reduced and the beneficial effects of compact structure and easy installation are achieved by the positions of the motherboard and the back plate.

In the disclosure, the following should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and a size of a layer or area may be enlarged or narrowed, that is, the drawings are not drawn in a real scale.

(3) In case of no conflict, features in one embodiment or in different embodiments can be combined as a new embodiment.

What is described above is related to the illustrative embodiments of the disclosure only and not limitative to the scope of the disclosure; the scopes of the disclosure are defined by the accompanying claims.

The invention claimed is:

1. An electronic shelf label, comprising:

a housing, the housing comprising a front housing and a rear housing, the front housing and the rear housing being coupled with each other, a chamber being provided between the front housing and the rear housing, the rear housing comprising an opening;

a motherboard, the motherboard being located in the chamber;

a back plate, the back plate covering the opening, the motherboard being detachably coupled to the back plate, the back plate being detachably coupled to the rear housing;

a circuit board, wherein the circuit board is located on a side of the motherboard facing towards the back plate, and the circuit board is fixed to the motherboard, wherein the motherboard comprises a communication interface, the back plate has a convex portion, the convex portion has a cavity for accommodating the communication interface.

2. The electronic shelf label according to claim 1, wherein the back plate together with the motherboard is detachably coupled to the rear housing.

3. The electronic shelf label according to claim 2, wherein the motherboard is configured to pass through the opening of the rear housing to reach the chamber.

4. The electronic shelf label according to claim 1, wherein the motherboard is configured to pass through the opening of the rear housing to reach the chamber.

5. The electronic shelf label according to claim 4, wherein the motherboard and the rear housing are located on a same side of the back plate, an area of the opening is larger than an area of the motherboard, so that the motherboard passes through the opening of the rear housing.

6. The electronic shelf label according to claim 1, wherein a gap is provided between the motherboard and the back plate, a height of the gap is greater than or equal to a height of the circuit board.

7. The electronic shelf label according to claim 1, wherein the communication interface comprises a power interface, the power interface is located on a surface of the motherboard facing towards the back plate, the convex portion comprises a first convex portion at a position corresponding to the power interface, the first convex portion covers the power interface.

8. The electronic shelf label according to claim 7, wherein the first convex portion comprises a first via hole, an end of the power interface and the first via hole are connected with each other, an end of the first convex portion away from the back plate is flush with an end of the power interface away from the motherboard.

9. The electronic shelf label according to claim 8, wherein the communication interface further comprises a network interface, the network interface is located on the surface of the motherboard facing towards the back plate, the back plate is provided with a second convex portion at a position corresponding to the network interface, the second convex portion covers the network interface.

10. The electronic shelf label according to claim 7, wherein the communication interface further comprises a network interface, the network interface is located on the surface of the motherboard facing towards the back plate, the convex portion further comprises a second convex portion at a position corresponding to the network interface, the second convex portion covers the network interface.

11. The electronic shelf label according to claim 10, wherein the second convex portion comprises a second via hole, an end of the network interface and the second via hole are connected with each other, an end of the second convex portion away from the back plate is flush with an end of the network interface away from the motherboard.

12. The electronic shelf label according to claim 11, wherein the network interface and the power interface are located on a same surface of the motherboard, and the network interface and the power interface are adjacent to each other, the second convex portion and the first convex portion are coupled to each other.

13. The electronic shelf label according to claim 12, wherein the second convex portion, the first convex portion, and the back plate are formed as an integral structure.

14. The electronic shelf label according to claim 12, wherein the motherboard is detachably coupled to the back plate by a first fastener, and the back plate is detachably coupled to the rear housing by a second fastener, the first fastener is closer to the circuit board than the second fastener.

15. A method for assembling an electronic shelf label, the electronic shelf label comprising:
- a housing, the housing comprising a front housing and a rear housing, the front housing and the rear housing being coupled with each other, a chamber being provided between the front housing and the rear housing, the rear housing comprising an opening;
- a motherboard, the motherboard being located in the chamber;
- a back plate, the back plate covering the opening, the motherboard being detachably coupled to the back plate, the back plate being detachably coupled to the rear housing; and
- a circuit board, wherein the circuit board is located on a side of the motherboard facing towards the back plate, and the circuit board is fixed to the motherboard;
- wherein the motherboard comprises a communication interface, the back plate has a convex portion, the convex portion has a cavity for accommodating the communication interface, wherein the method comprising:

coupling the front housing with the rear housing to form the chamber;

fixing the motherboard to the back plate; and fixing the back plate to the rear housing, wherein at a same time of fixing the back plate to the rear housing, the motherboard passes through the opening of the rear housing and reaches the chamber.

\* \* \* \* \*